(12) United States Patent
Kim et al.

(10) Patent No.: US 9,133,550 B2
(45) Date of Patent: *Sep. 15, 2015

(54) ETCHING COMPOSITION, METHOD OF FORMING A METAL PATTERN USING THE ETCHING COMPOSITION, AND METHOD OF MANUFACTURING A DISPLAY SUBSTRATE

(75) Inventors: In-Bae Kim, Yongin-si (KR); Jong-Hyun Choung, Hwaseong-si (KR); Ji-Young Park, Hwaseong-si (KR); Seon-Il Kim, Seoul (KR); Jae-Woo Jeong, Incheon (KR); Sang Gab Kim, Seoul (KR); Sang-Woo Kim, Seongnam-si (KR); Ki-Beom Lee, Seoul (KR); Dae-Woo Lee, Seoul (KR); Sam-Young Cho, Anyang-si (KR)

(73) Assignee: Samsung Display Co., Ltd., Yongin (KR)

( * ) Notice: Subject to any disclaimer, the term of this patent is extended or adjusted under 35 U.S.C. 154(b) by 588 days.

This patent is subject to a terminal disclaimer.

(21) Appl. No.: 13/433,013

(22) Filed: Mar. 28, 2012

(65) Prior Publication Data

US 2013/0034923 A1    Feb. 7, 2013

(30) Foreign Application Priority Data

Aug. 5, 2011  (KR) .......................... 10-2011-0078297

(51) Int. Cl.
  *C09K 13/00*   (2006.01)
  *C23F 1/18*    (2006.01)

(Continued)

(52) U.S. Cl.
  CPC . *C23F 1/18* (2013.01); *C09K 13/08* (2013.01); *C23F 1/26* (2013.01); *H01L 21/32134* (2013.01); *H01L 27/124* (2013.01)

(58) Field of Classification Search
  CPC ................. C23F 1/18; C23F 1/46; C23F 1/26; C23F 1/34; C09K 13/08; C09K 13/06; H01L 21/32134; H01L 27/124
  USPC ............................................... 252/79.1–79.4
  See application file for complete search history.

(56) References Cited

U.S. PATENT DOCUMENTS

| | | | |
|---|---|---|---|
| 4,725,374 A * | 2/1988 | Pryor et al. | ................... 252/79.2 |
| 2004/0118814 A1* | 6/2004 | Kim et al. | ........................ 216/96 |

(Continued)

FOREIGN PATENT DOCUMENTS

| | | |
|---|---|---|
| JP | 2001-059191 | 3/2001 |
| KR | 10-2000-0032999 | 6/2000 |

(Continued)

*Primary Examiner* — Shamim Ahmed
(74) *Attorney, Agent, or Firm* — H.C. Park & Associates, PLC (57) ABSTRACT

An etching composition, a method of forming a metal pattern using the etching composition, and a method of manufacturing a display substrate are disclosed. The etching composition includes about 0.1% by weight to about 25% by weight of ammonium persulfate, about 0.1% by weight to about 25% by weight of an organic acid, about 0.01% by weight to about 5% by weight of a chelating agent, about 0.01% by weight to about 5% by weight of a fluoride compound, about 0.01% by weight to about 5% by weight of a chloride compound, about 0.01% by weight to about 2% by weight of an azole-based compound and a remainder of water. Thus, a copper layer may be stably etched to improve a reliability of manufacturing the metal pattern and the display substrate.

7 Claims, 4 Drawing Sheets

(51) Int. Cl.
*C23F 1/26* (2006.01)
*H01L 21/3213* (2006.01)
*C09K 13/08* (2006.01)
*H01L 27/12* (2006.01)

(56) References Cited

U.S. PATENT DOCUMENTS

2005/0258522 A1* 11/2005 En et al. .................. 257/670

2007/0196975 A1* 8/2007 Nomura et al. ............... 438/230
2011/0056913 A1* 3/2011 Mayer et al. .................... 216/84

FOREIGN PATENT DOCUMENTS

| | | |
|---|---|---|
| KR | 10-2002-0050020 | 6/2002 |
| KR | 10-2005-0000682 | 1/2005 |
| KR | 10-2010-0040004 | 4/2010 |
| KR | 10-2010-0123131 | 11/2010 |
| KR | 2010-0123131 A * | 11/2010 |

* cited by examiner

| Concentration of Copper ion | Time | Gate Line | Data Line |
|---|---|---|---|
| 0 ppm | 0 hour | | |
| 1,000 ppm | 3 hours | | |
| 2,000 ppm | 6 hours | | |
| 3,000 ppm | 9 hours | | |
| 4,000 ppm | 12 hours | | |

FIG. 8

ETCHING COMPOSITION, METHOD OF FORMING A METAL PATTERN USING THE ETCHING COMPOSITION, AND METHOD OF MANUFACTURING A DISPLAY SUBSTRATE

CROSS REFERENCE TO RELATED APPLICATION

This application claims priority from and the benefit of Korean Patent Application No. 2011-0078297, filed on Aug. 5, 2011, which is hereby incorporated by reference for all purposes as if fully set forth herein.

BACKGROUND

1. Field

Exemplary embodiments of the present invention relate to an etching composition, a method of forming a metal pattern using the etching composition, and a method of manufacturing a display substrate. More particularly, exemplary embodiments of the present invention relate to an etching composition used for manufacturing a display substrate, a method of forming a metal pattern using the etching composition, and a method of manufacturing a display substrate.

2. Discussion of the Background

Generally, a display substrate used for a display device includes a thin-film transistor ("TFT") as a switching element for driving each one of a plurality of pixel regions, a signal line connected to the TFT and a pixel electrode. The signal line includes a gate line transmitting a gate driving signal, and a data line crossing the gate line and transmitting a data driving signal.

As a size of the display device and a requirement of a customer for a high resolution are increased, a length of the gate line or the data line is increased and a width of the gate line or the data line is decreased so that an electric resistance is increased. Thus, a resistance-capacitance ("RC") signal delay is caused, and then the gate line or the data line is formed from a metal having a relatively low resistance in order to solve the RC signal delay.

Copper as a metal having a relatively low resistance and used for forming the gate line or the data line has excellent electric conductivity and is a plentiful natural resource. In addition, copper has a resistance much lower than aluminum or chromium. In contrast, a resistance for an oxidizer of copper is higher than that of aluminum or chromium, so that a strong oxidizer may be used for etching a copper layer. Examples of a material that may be widely used for the strong oxidizer include hydrogen peroxide ($H_2O_2$) or iron (III) hydroxide ($Fe(OH)_3$), etc. Korean Publication No. 2002-0050020 discloses a mixture of hydrogen peroxide, an inorganic acid or a neutral salt as an etchant for etching a copper layer, and Korean Publication No. 2005-0000682 discloses an etchant including hydrogen peroxide, a copper inhibitor, and hydrogen peroxide stabilizer and a fluoric ion. In addition, Korean Publication No. 2000-0032999 discloses a mixture of iron chloride 6-hydrate ($FeCl_3.6H_2O$) and hydrofluoric acid (HF).

However, although a copper etchant including the strong oxidizer such as hydrogen peroxide or iron (III) hydroxide effectively etches the copper layer, the copper etchant may damage patterns, which are formed prior to the copper layer, in the course of etching the copper layer. In addition, since the copper etchant includes the strong oxidizer, an etch rate of the copper layer is difficult to control so that the copper layer may be etched to have a shape different from a shape which is theoretically designed by a user.

SUMMARY OF THE INVENTION

Exemplary embodiments of the present invention provide an etching composition capable of improving etching process margins and stability without using a strong oxidizer as a main component etching copper.

Exemplary embodiments of the present invention also provide a method of forming a metal pattern using the etching composition capable of improving a manufacturing reliability.

Exemplary embodiments of the present invention also provide a method of manufacturing a display substrate using the etching composition capable of improving a manufacturing reliability.

Additional features of the invention will be set forth in the description which follows, and in part will be apparent from the description, or may be learned by practice of the invention.

An exemplary embodiment of the present invention discloses an etching composition includes about 0.1% by weight to about 25% by weight of ammonium persulfate, about 0.1% by weight to about 25% by weight of an organic acid, about 0.01% by weight to about 5% by weight of a chelating agent, about 0.01% by weight to about 5% by weight of a fluoride compound, about 0.01% by weight to about 5% by weight of a chloride compound, about 0.01% by weight to about 2% by weight of an azole-based compound, and a remainder of water.

An exemplary embodiment of the present invention also discloses a method of forming a metal pattern in which a copper layer is formed on a substrate, and a photo pattern is formed on the copper layer. The copper layer is patterned using the photo pattern as an etch stopping layer and an etching composition including about 0.1% by weight to about 25% by weight of ammonium persulfate, about 0.1% by weight to about 25% by weight of an organic acid, about 0.01% by weight to about 5% by weight of a chelating agent, about 0.01% by weight to about 5% by weight of a fluoride compound, about 0.01% by weight to about 5% by weight of a chloride compound, about 0.01% by weight to about 2% by weight of an azole-based compound and a remainder of water, to form a metal pattern.

An exemplary embodiment of the present invention also discloses a method of manufacturing a display substrate. In the method, a first copper layer is formed on a substrate, and a photo pattern is formed on the first copper layer. The first copper layer is patterned using the photo pattern as an etch stopping layer and an etching composition including about 0.1% by weight to about 25% by weight of ammonium persulfate, about 0.1% by weight to about 25% by weight of an organic acid, about 0.01% by weight to about 5% by weight of a chelating agent, about 0.01% by weight to about 5% by weight of a fluoride compound, about 0.01% by weight to about 5% by weight of a chloride compound, about 0.01% by weight to about 2% by weight of an azole-based compound and a remainder of water, thereby forming a first signal line. After forming a second signal line crossing the first signal line, a pixel electrode connected to a thin-film transistor, which is connected to the first and second signal lines, is formed.

It is to be understood that both the foregoing general description and the following detailed description are exemplary and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Etching Composition

An etching composition according to an exemplary embodiment of the present invention includes ammonium persulfate (($NH_4$)$_2S_2O_8$,), an organic acid, a chelating agent, a fluoride compound, a chloride compound, an azole-based compound and water. Hereinafter, the above components will be respectively illustrated in detail.

(a) Ammonium Persulfate

Ammonium persulfate serves as an oxidizer and a main etching component of the etching composition that may be used for etching a metal layer including copper. The metal layer may have a single-layered structure including copper or a multiple-layered structure including a copper layer and a titanium layer. Ammonium persulfate having a degree of purity, which may be used for manufacturing a semiconductor, may be preferable. Ammonium persulfate may etch the metal layer through a chemical reaction presented by Chemical Equation 1 to form a stable compound.

$$S_2O_8^{-2}+2Cu \rightarrow 2CuSO_4 \qquad \text{<Chemical Equation 1>}$$

When an amount of ammonium persulfate is less than about 0.1% by weight based on a total weight of the etching composition, the etching composition may not etch the metal layer. When the amount of ammonium persulfate is greater than about 25% by weight, the etching composition may excessively etch at a fast rate which makes it difficult to control an etching time. Thus, the amount of ammonium persulfate may be between about 0.1% by weight and about 25% by weight based on the total weight of the etching composition. According to other exemplary embodiments, the amount of ammonium persulfate may be between about 0.1% by weight and about 10% by weight.

(b) Organic Acid

The organic acid serves as a sub-oxidizer etching the metal layer and prevents an etching rate from being slowed by a copper ion generated in the course of etching the metal layer.

Examples of the organic acid may include oxalic acid, oxalacetic acid, fumaric acid, malic acid, succinic acid, acetic acid, butyric acid, palmitic acid, tartaric acid, ascorbic acid, uric acid, sulfonic acid, sulfinic acid, formic acid, citric acid, isocitric acid, α-ketoglutaric acid, glycolic acid, etc. These can be used alone or in a combination thereof. Preferably, citric acid and/or glycolic acid may be used as the organic acid.

When an amount of the organic acid is less than about 0.1% by weight based on the total weight of the etching composition, an effect of the copper ion for the metal layer may not decrease. When the amount of the organic acid is greater than about 25% by weight, the organic acid may excessively etch at a fast rate with ammonium persulfate so as to break a metal pattern as a result of etching the metal layer. Thus, the amount of the organic acid may be between about 0.1% by weight and about 25% by weight based on the total weight of the etching composition. When a single compound is used as the organic acid, the amount of the organic acid may be between about 0.1% by weight and about 25% by weight. Alternatively, when at least two compounds are used in the organic acid, the amount of the organic acid is substantially the same as a total amount of at least two compounds. The total amount may be between about 0.1% by weight and about 25% by weight. For example, the organic acid may include citric acid between about 0.05% by weight and about 20% by weight and glycolic acid between about 0.05% by weight and about 5% by weight. Thus, a range of the total amount of citric acid and glycolic acid may be substantially the same as a range of the amount of the organic acid.

(c) Chelating Agent

The chelating agent may be combined with a copper ion generated in the course of etching the metal layer in order to minimize the effect of the copper ion on the etching rate of the etching composition.

Examples of the chelating agent may include nitrilotriacetic acid, alanine, amino butyric acid, glutamic acid, glycine, iminodiacetic acid, or sarcosine, etc. These can be used alone or in a combination thereof.

When an amount of the chelating agent is less than about 0.01% by weight based on the total weight of the etching composition, the chelating agent alone may not decrease an amount of the copper ion. When the amount of the chelating agent is greater than about 5% by weight, the etching rate of the etching composition may be decreased by the chelating agent. Thus, the amount of the chelating agent may be between about 0.01% by weight and about 5% by weight.

(d) Fluoride Compound

The fluoride compound serves as a compound including fluorine ("F") and is a main component etching a titanium layer when the metal layer includes the titanium layer.

Examples of the fluoride compound may include hydrofluoric acid (HF), sodium fluoride (NaF), sodium bifluoride (NaHF$_2$), ammonium fluoride (NH$_4$F), ammonium bifluoride (NH$_4$HF), ammonium fluoroborate (NH$_4$BF$_4$), potassium fluoride (KF), potassium bifluoride (KHF$_2$), aluminium fluoride (AlF$_3$), hydrofluoroboric acid (HBF$_4$), lithium fluoride (LiF), potassium fluoroborate (KBF$_4$), calcium fluoride (CaF$_2$) and hexafluorosilicic acid (H$_2$SiF$_6$). These can be used alone or in a combination thereof.

When an amount of the fluoride compound is less than about 0.01% by weight based on the total weight of the etching composition, the titanium layer may be difficult to be etched. When the amount of the fluoride compound is greater than about 5% by weight, a lower layer of the titanium layer or a substrate may be damaged by the etching composition. Thus, the amount of the fluoride compound may be between about 0.01% by weight and about 5% by weight based on the total weight of the etching composition.

(e) Chloride Compound

The chloride compound serves as a compound including chlorine ("Cl") and may prevent the metal layer from being eroded so that the metal layer may be uniformly etched.

Examples of the chloride compound may include hydrochloric acid (HCl), ammonium chloride (NH$_4$Cl), potassium chloride (KCl), iron (III) chloride (FeCl$_3$), sodium chloride (NaCl), ammonium perchlorate (NH$_4$ClO$_4$), potassium perchlorate (K$_4$ClO$_4$), sodium perchlorate (Na$_4$ClO$_4$), zinc chloride (ZnCl$_2$), etc. These can be used alone or in a combination thereof.

When an amount of the chloride compound is less than about 0.01% by weight based on the total weight of the etching composition, the metal pattern may be broken. When the amount of the chloride compound is greater than about 5% by weight, the etching rate of the etching composition may be difficult to control. Thus, the amount of the chloride compound may be between about 0.01% by weight and about 5% by weight based on the total weight of the etching composition.

(f) Azole-Based Compound

The azole-based compound includes a pentagonal hetero ring containing a nitrogen atom and at least one atom other than carbon. The azole-based compound may inhibit etching copper in the metal layer to control the etching rate between the copper layer and the titanium layer when the titanium layer is formed on and/or under the copper layer. The azole-based compound may decrease a cut dimension loss ("CD loss") of a metal line.

Examples of the azole-based compound may include benzotriazole, aminotetrazole, aminotetrazole potassium salt, imidazole, pyrazole, etc. When an amount of the azole-based compound is less than about 0.01% by weight based on the total weight of the etching composition, the etching rate between the copper layer and the titanium layer may not be controlled and a direct characteristic may be excessively decreased. When the amount of the azole-based compound is greater than about 2% by weight, an etching ability of the etching composition may be decreased by the azole-based compound. Thus, the amount of the azole-based compound may be between about 0.01% by weight and about 2% by weight.

(g) Water

Water occupies a reminder of the etching composition, from which ammonium persulfate, the organic acid, the chelating agent, the fluoride compound, the chloride compound and the azole-based compound except for water are excluded. Water is added into ammonium persulfate, the organic acid, the chelating agent, the fluoride compound, the chloride compound and the azole-based compound such that the total weight of the etching composition is about 100% by weight. Ultra-pure water or water having a degree of purity which may be used for manufacturing a semiconductor, may be used. An amount of water may be about 33% by weight to about 99.76% by weight based on the total weight of the etching composition.

Hereinafter, the etching composition according to an exemplary embodiment of the present invention will be illustrated with Examples and Comparative Examples in detail.

Preparation of Etching Composition

Etching compositions according to Examples 1 to 3 of the present invention and Comparative Examples 1 to 5 were prepared according to Table 1. In Table 1, amounts of components are based on "% by weight."

TABLE 1

|  | APS | Organic acid 1 | Organic acid 2 | Chelating agent | Fluoride compound 1 | Fluoride compound 2 | Chloride compound | Azole-based compound |
|---|---|---|---|---|---|---|---|---|
| Example 1 | 7 | 18 | 1.5 | 0.1 | 0.4 | 0.5 | 0.1 | 0.5 |
| Example 2 | 10 | 20 | 2 | 0.5 | 0.4 | 0.3 | 0.2 | 0.3 |
| Example 3 | 12 | 15 | 3 | 1 | 0.5 | 0.4 | 0.1 | 0.5 |
| Comparative Example 1 | 7 | 18 | — | 0.1 | 0.4 | 0.5 | 0.1 | 0.5 |
| Comparative Example 2 | 7 | 18 | 1.5 | — | 0.4 | 0.5 | 0.1 | 0.5 |
| Comparative Example 3 | 7 | 18 | 1.5 | 0.1 | — | 0.5 | 0.1 | 0.5 |
| Comparative Example 4 | 7 | 18 | 1.5 | 0.1 | 0.4 | 0.5 | 0.1 | 2.1 |
| Comparative Example 5 | 7 | 18 | 1.5 | 0.1 | 0.4 | 0.5 | — | 0.5 |

In table 1, the "APS" represents ammonium persulfate, the "organic acid 1" represents citric acid, and the "organic acid 2" represents glycolic acid. In addition, the fluoride compound 1 represents hydrofluoric acid (HF) and the chloride compound represents hexafluorosilicic acid (H$_2$SiF$_6$).

In each of the etching compositions according to Example 1 to 3, a remainder, except for the amounts of the components represented in Table 1, consists of water. In the etching composition according to Example 1, a sum of the amounts of the components represented in Table 1 is about 28.1% by weight, and about 71.9% by weight of the remainder, except for the components, is water. In addition, the etching composition according to Example 2 includes water of about 66.3% by weight, and the etching composition according to Example 3 includes water of about 67.5% by weight. In addition, the etching composition according to Comparative Example 1 includes water of about 73.4% by weight, the etching composition according to Comparative Example 2 includes water of about 72% by weight, and the etching composition according to Comparative Example 3 includes water of about 72.3% by weight. The etching composition according to Comparative Example 4 includes water of about 70.3% by weight, and the etching composition according to Comparative Example 5 includes water of about 72% by weight.

Evaluation of Characteristics of Etching Composition—1

Figure 2:
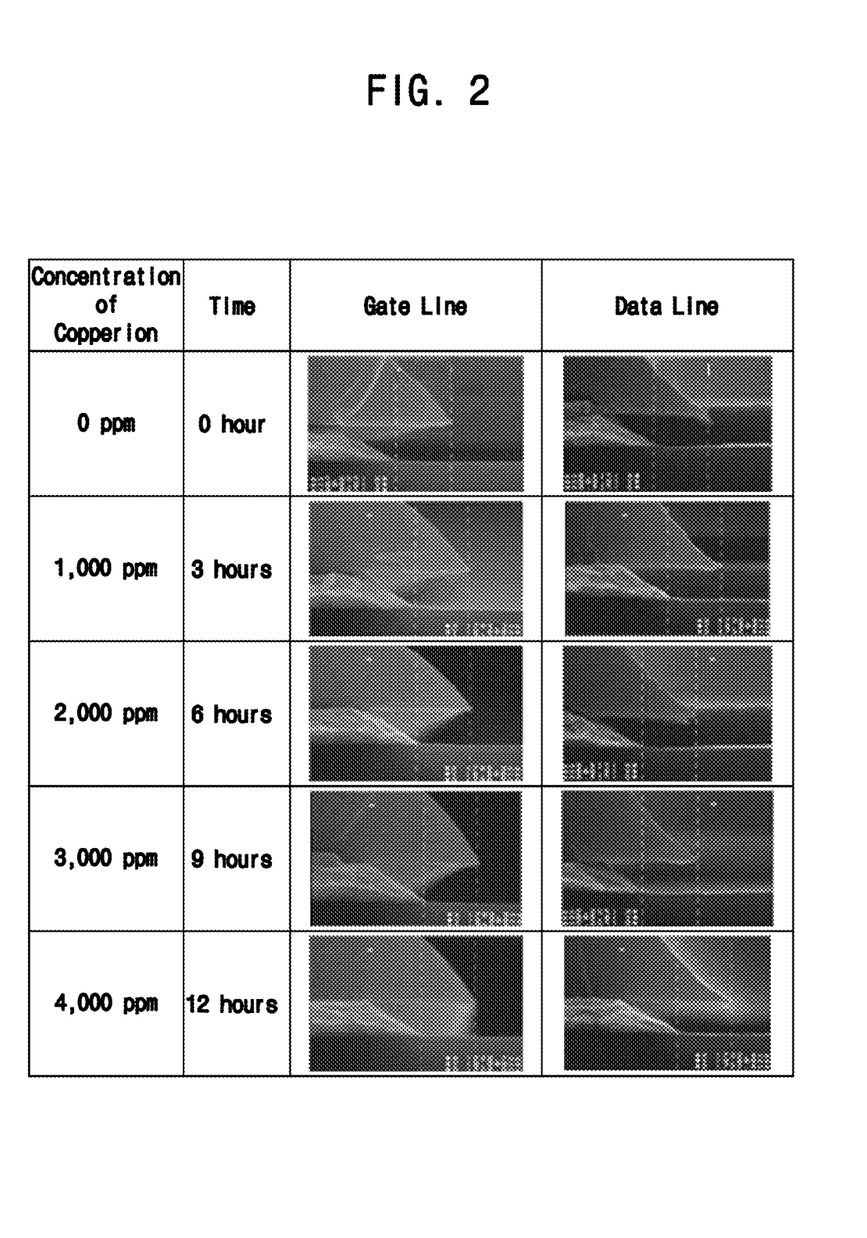
FIG. 2 is a view including SEM pictures of edge portions of a photo pattern and a metal pattern formed by etching a metal layer using the etching composition according to Example 1 of an exemplary embodiment of the present invention over a period of several hours when the etching composition is contaminated by a copper ion.

A metal layer having a thickness of about 5,000 Å was etched using each of the etching compositions according to Examples 1 to 3 and Comparative Examples 1 to 5 to measure an etching end point. Thus, obtained results are illustrated in FIG. 2.

A gate metal layer of a double-layered structure, including a titanium layer having a thickness of about 100 Å and a copper layer having a thickness of about 5,000 Å formed on the titanium layer, was etched using each of the etching compositions according to Examples 1 to 3 and Comparative Examples 1 to 5, thereby forming a gate line on a substrate. In addition, a source metal layer of a double-layered structure, including a titanium layer having a thickness of about 100 Å and a copper layer having a thickness of about 5,000 Å formed on the titanium layer, was etched using each of the etching compositions according to Examples 1 to 3 and Comparative Examples 1 to 5, thereby forming a data line on the substrate on which the gate line is formed. Then, each of the gate metal layer and the source metal layer was over-etched by about 100% based on the etching end point. A CD skew and a taper angle of the gate line and the source line formed via the above processes were measured. Thus, obtained results of the CD skew and the taper angle are illustrated in FIG. 2.

TABLE 2

|  | Etching end point (unit: seconds) | CD skew of gate line (unit: μm) | Taper angle of gate line (unit: °) | CD skew of data line (unit: μm) | Taper angle of data line (unit: °) |
| --- | --- | --- | --- | --- | --- |
| Example 1 | 28 | 0.714 | 40 | 0.708 | 45 |
| Example 2 | 28 | 0.750 | 41 | 0.723 | 46 |
| Example 3 | 28 | 0.725 | 40 | 0.739 | 45 |
| Comparative Example 1 | 30 | 0.632 | 39 | 0.632 | 42 |
| Comparative Example 2 | 24 | 0.884 | 57 | 0.896 | 51 |
| Comparative Example 3 | 29 | 0.685 | 50 | 0.667 | 50 |
| Comparative Example 4 | 32 | 0.597 | 32 | 0.574 | 34 |
| Comparative Example 5 | 28 | 0.720 | — | 0.703 | — |

In Table 2, the etching end point is defined as a time when the copper layer is etched to expose a glass substrate disposed under the copper layer. The shorter the etching end point the faster the etching rate. Referring to Table 2, the etching rate of the etching compositions according to Examples 1 to 3 is faster than that of the etching compositions according to Comparative Examples 1 and 3 to 5.

In Table 2, a CD (cut dimension) skew of the gate line is defined as a distance between an edge portion of a photo pattern used as an etch stopping layer in etching the gate metal layer and an edge portion of the gate line. Similar to the above definition, a CD skew of the data line is defined as a distance between a photo pattern used as an etch stopping layer in etching the data metal layer and an edge portion of the data line. The CD skew of each of the gate line and the data line may be preferably between about 0.6 μm to about 0.8 μm.

Referring to Table 2, the CD skew of each of the gate line and the data line formed using the etching compositions according to Examples 1 to 3 of the present invention is included in a range between about 0.6 μm to about 0.8 μm. Although the etching composition according to Comparative Example 2 has a fast etching end point, the CD skew of the gate and data line is excessively large and is not desirable.

The gate line may have a small taper angle since other metal patterns, for example, the data line, are formed on the glass substrate on which the gate line is formed. In addition, the data line may have a large taper angle. The taper angle of the gate line formed using the etching compositions according to Examples 1 to 3 is smaller than that of the data line formed using the etching compositions according to Examples 1 to 3. In contrast, the taper angle of the gate line formed using the etching composition according to Comparative Example 2 is larger than that of the data line formed using the etching composition according to Comparative Example 2.

In particular, when the data line is formed using the etching composition according to Comparative Example 5, the data line is partially broken. As mentioned above, the chloride compound may prevent the data line from being broken.

According to the above descriptions, the etching rate may be excellent and the taper angle may be controlled to have a range between about 40° to about 45° when the gate line and the data line are formed using the etching compositions according to Examples 1 to 3 of the present invention, as compared with the gate line and the data line that are formed using the etching composition according to Comparative Examples 1 to 5. In addition, since the CD skew is excellent, a linearity and a stability of a metal pattern including the gate line or the data line may be excellent.

Evaluation of Characteristics of Etching Composition—2

After the etching composition according to Example 1 of the present invention was kept at a room temperature of about 25° C. for about 7 days, the gate metal line was patterned to form a gate line and the data metal line was patterned to form a data line using the above etching composition, so that a storage stability was evaluated. Thus, obtained results are illustrated in Table 3 and FIG. 1.

TABLE 3

|  | Etching characteristic | 0 day | 3 days | 5 days | 7 days |
|---|---|---|---|---|---|
| Gate line | Etching end point | 28 seconds | 28 seconds | 28 seconds | 28 seconds |
|  | CD skew over-etched by about 100% | 0.720 μm | 0.710 μm | 0.714 μm | 0.697 μm |
|  | Taper angle | 40° | 40° | 40° | 40° |
| Data line | Etching end point | 28 seconds | 28 seconds | 28 seconds | 28 seconds |
|  | CD skew over-etched by about 100% | 0.703 μm | 0.697 μm | 0.679 μm | 0.703 μm |
|  | Taper angle | 45° | 44° | 45° | 44° |

Figure 1:
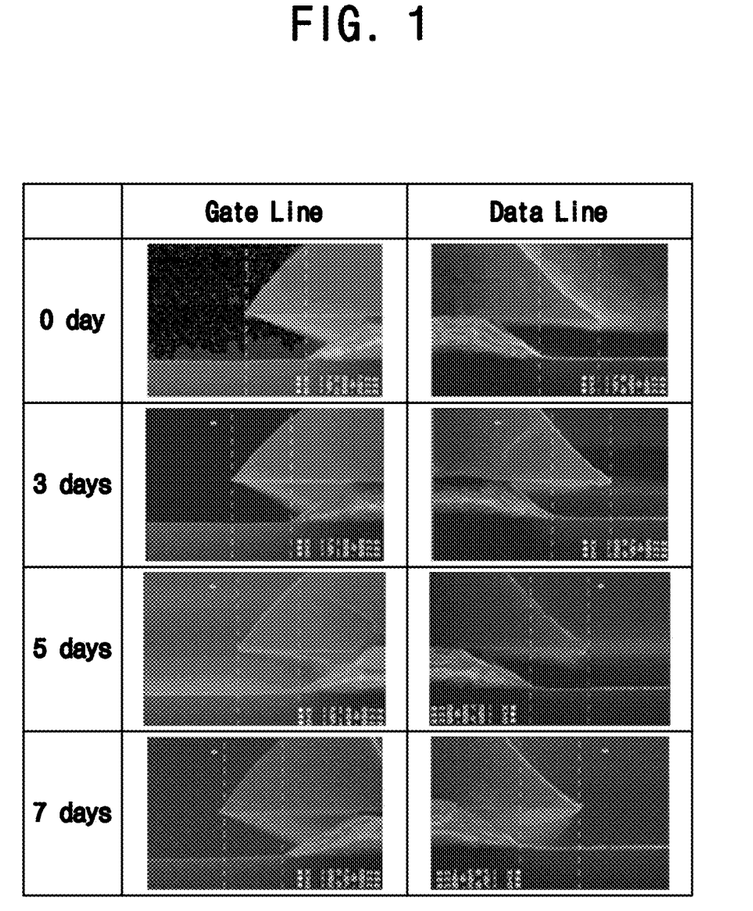
FIG. 1 is a view including scanning electron microscope ("SEM") pictures of edge portions of a photo pattern and a metal pattern formed by etching a metal layer using an etching composition according to Example 1 of an exemplary embodiment of the present invention over a period of several days when the etching composition is kept at a room temperature.

FIG. 1 is a view including scanning electron microscope ("SEM") pictures of edge portions of a photo pattern and a metal pattern formed by etching a metal layer using an etching composition according to Example 1 of the present invention when the etching composition is kept at a room temperature for several days.

Referring to Table 3 with FIG. 1, an etching characteristic of the etching composition according to Example 1 of the present invention is little changed until at least 7 days have elapsed. Although not shown in Table 3, after 8 days have elapsed, the etching end point increases about 1 second every day to decrease an etching ability of the etching composition. However, an initial etching ability may be advantageously maintained without change for about 7 days when the etching composition is kept at a room temperature.

Evaluation of Characteristics of Etching Composition—3

The etching composition according to Example 1 of the present invention was contaminated by a copper ion of about 330 ppm (parts per million) per hour for about 12 hours. A gate line and a data line were formed using the above etching composition and subsequently evaluated. Thus, obtained results are illustrated in Table 4 and FIG. 2.

TABLE 4

|  |  | Concentration of a copper ion | | | | |
|---|---|---|---|---|---|---|
|  |  | 0 ppm | 1,000 ppm | 2,000 ppm | 3,000 ppm | 4,000 ppm |
|  | time | 0 hour | 3 hours | 6 hours | 9 hours | 12 hours |
| Gate line | Etching ending point | 28 seconds | 28 seconds | 28 seconds | 28 seconds | 28 seconds |
|  | CD skew over-etched by about 100% | 0.720 μm | 0.710 μm | 0.714 μm | 0.697 μm | 0.720 μm |
|  | Taper angle | 40° | 40° | 40° | 40° | 40° |
| Data line | Etching ending point | 28 seconds | 28 seconds | 28 seconds | 28 seconds | 28 seconds |
|  | CD skew over-etched by about 100% | 0.703 μm | 0.697 μm | 0.679 μm | 0.703 μm | 0.732 μm |
|  | Taper angle | 45° | 44° | 45° | 44° | 45° |

FIG. 2 is a view including SEM pictures of edge portions of a photo pattern and a metal pattern formed by etching a metal layer using the etching composition according to Example 1 of the present invention for several hours when the etching composition is contaminated by a copper ion.

Referring to Table 4, with FIG. 2, an etching characteristic of the etching composition according to Example 1 of the present invention is little changed until a concentration of the copper ion is about 4,000 ppm. That is, an initial etching ability of the etching composition according to Example 1 of the present invention may be advantageously maintained although the etching composition etches the metal layer including the titanium layer and the copper layer many times.

According to the above descriptions, an etching composition using a non-peroxide based etchant including ammonium persulfate may stably etch a double-layered structure including a titanium layer and a copper layer or a single-layered structure including a copper layer. In addition, the storage stability and the etching ability of the etching composition may be improved. In particular, the etching composition of the present invention includes a chloride compound to prevent a metal pattern, including the gate line or the data line, from being broken.

Method of Manufacturing a Display Substrate

Hereinafter, referring to FIGS. 3 to 8, a method of manufacturing a display substrate including a metal pattern including a gate line or a data line using the etching composition according to the present invention will be described.

FIGS. 3 to 8 are cross-sectional views illustrating a method of manufacturing a display substrate according to an exemplary embodiment of the present invention.

Figure 3:
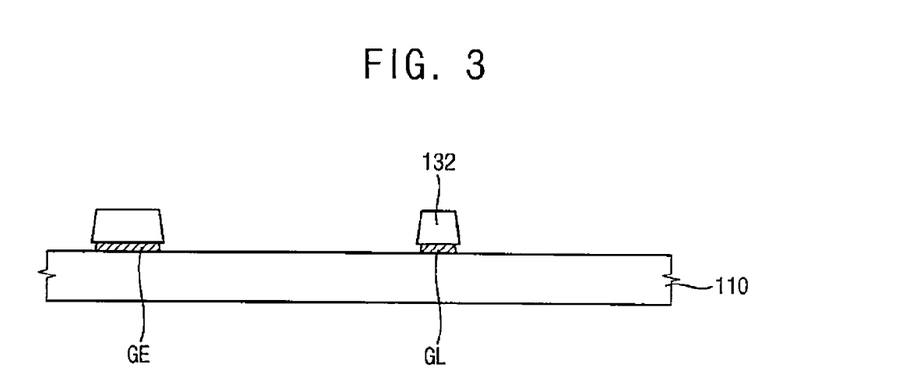
FIG. 3, FIG. 4, FIG. 5, FIG. 6, FIG. 7, and FIG. 8 are cross-sectional views illustrating a method of manufacturing a display substrate according to an exemplary embodiment of the present invention.

Referring to FIG. 3, a gate metal layer is formed on a base substrate 110 and a first photo pattern 132 is formed on the gate metal layer. The gate metal layer may include a copper layer. Alternatively, the gate metal layer may include a titanium layer formed on the base substrate 110 and a copper layer formed on the titanium layer.

The gate metal layer is etched using the first photo pattern 132 as an etch stopping layer to form a gate pattern including a gate line GL as a first signal line and a control electrode GE connected to the gate line GL.

The gate metal layer is etched using an etching composition including about 0.1% by weight to about 25% by weight of ammonium persulfate, about 0.1% by weight to about 25% by weight of an organic acid, about 0.01% by weight to about 5% by weight of a chelating agent, about 0.01% by weight to about 5% by weight of a fluoride compound, about 0.01% by weight to about 5% by weight of a chloride compound, about 0.01% by weight to about 2% by weight of an azole-based compound, and a remainder of water. When the gate metal layer has a single-layered structure including the copper layer or a multiple-layered structure including the copper layer and the titanium layer, the etching composition may etch the gate metal layer. Although the gate line GL is a signal line extending in a first direction on the base substrate 110, the etching composition etches the gate metal layer to prevent the gate line GL from being broken. The etching composition is substantially the same as the etching composition above described according to the present invention, and thus any repetitive descriptions will be omitted.

Figure 4:
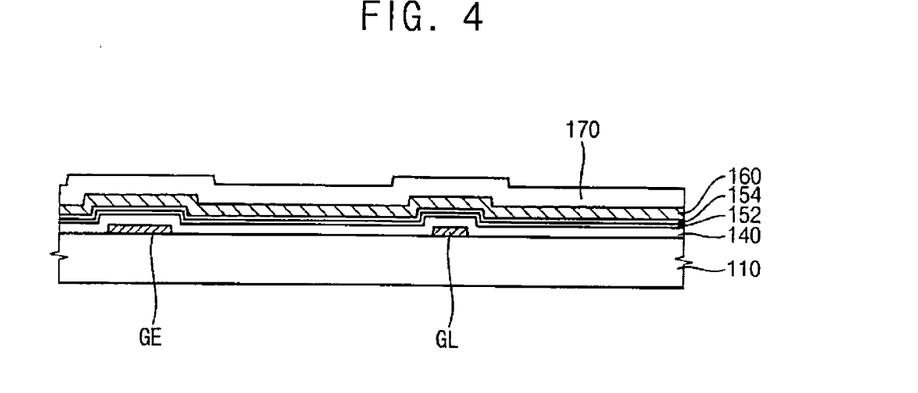

Referring to FIG. 4, a gate insulating layer 140, a semiconductor layer 152, an ohmic contact layer 154 and a source metal layer 160 are sequentially formed on the base substrate 110 on which the gate pattern is formed. A photoresist layer 170 is formed on the source metal layer 160. The source metal layer 160 may include a copper layer. Alternatively, the source metal layer 160 may include a titanium layer formed on the ohmic contact layer 154 and a copper layer formed on the titanium layer.

Figure 5:
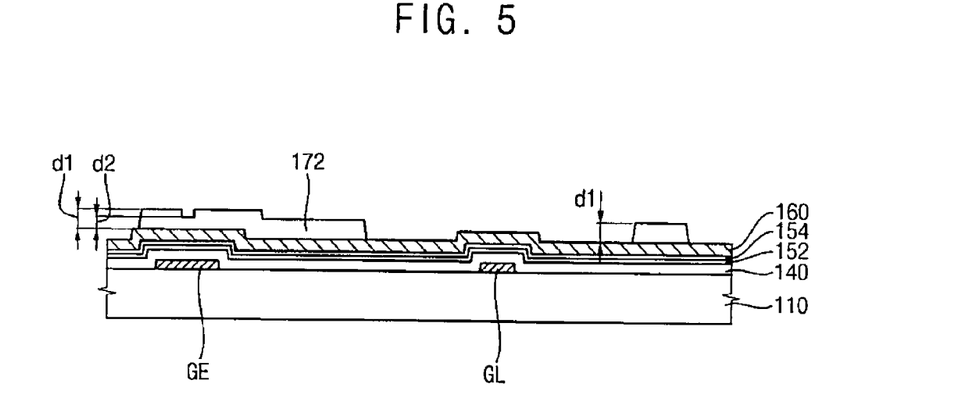

Referring to FIG. 5, the photoresist layer 170 is exposed and developed to form a second photo pattern 172. The second photo pattern 172 may be formed using a mask including a light-transmitting portion transmitting light, a light-blocking portion blocking the light and a semi-transmitting portion. By using the mask, the second photo pattern 172 includes a first thickness portion having a first thickness d1 substantially similar to an initial thickness of the photoresist layer 170, and a second thickness portion having a second thickness d2 which is thinner than the first thickness.

Figure 6:
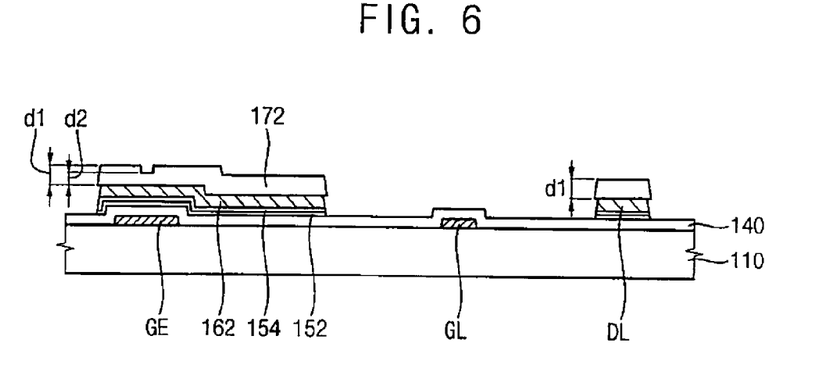

Referring to FIG. 6, the source metal layer 170 is patterned using the second photo pattern 172 as an etching mask and an etching composition including about 0.1% by weight to about 25% by weight of ammonium persulfate, about 0.1% by weight to about 25% by weight of an organic acid, about 0.01% by weight to about 5% by weight of a chelating agent, about 0.01% by weight to about 5% by weight of a fluoride compound, about 0.01% by weight to about 5% by weight of a chloride compound, about 0.01% by weight to about 2% by weight of an azole-based compound, and a remainder of water. The etching composition used for etching the source metal layer 170 may be substantially the same as the etching composition used for etching the gate metal layer. Thus, any repetitive descriptions will be omitted. The source metal layer 170 is etched using the etching composition so that the data line DL extending in a direction of the base substrate 110 may be prevented from being broken. In particular, the chloride compound of the etching composition may prevent the data line DL from being broken by being excessively etched.

Thus, the data line DL as a second signal line crossing the gate line GL and a switching pattern 162 connected to the data line DL are formed. Then, the ohmic contact layer 154 and the semiconductor layer 152 are etched using the second photo pattern 172 and the switching pattern 162 as an etch stopping layer.

A portion of the second photo pattern 172 is removed. In particular, the second thickness portion of the second photo pattern 172 is removed and a thickness of the first thickness portion decreases to form a residual pattern (not shown). The switching pattern 162 is partially exposed by the residual pattern and is etched using the residual pattern as an etch stopping layer and the etching composition.

Figure 7:
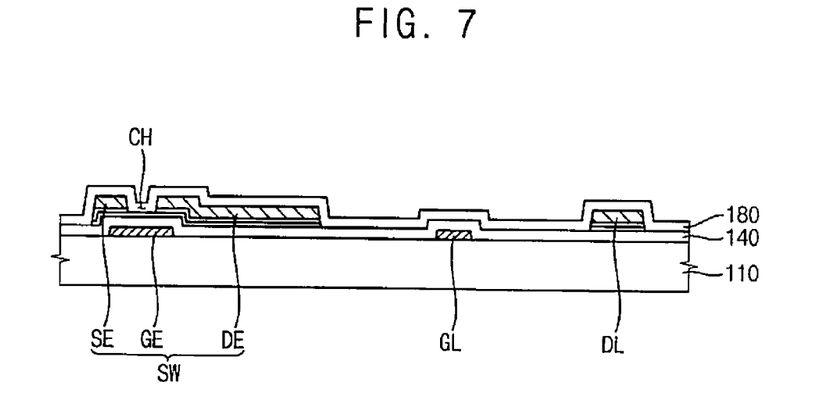

Referring to FIG. 7, the switching pattern 162 is etched using the residual pattern to form an input electrode SE connected to the data line DL and an output electrode DE spaced apart from the input electrode SE. The input electrode SE and the output electrode DE define a thin-film transistor SW with the control electrode GE. The switching pattern 162 exposed by the residual pattern is removed to form a channel region of the thin-film transistor SW.

The ohmic contact layer 154 in the channel region is removed using the input electrode SE, the output electrode DE and the residual pattern as an etch stopping layer. Thus, a channel portion CH of the thin-film transistor SW may be formed.

Figure 8:
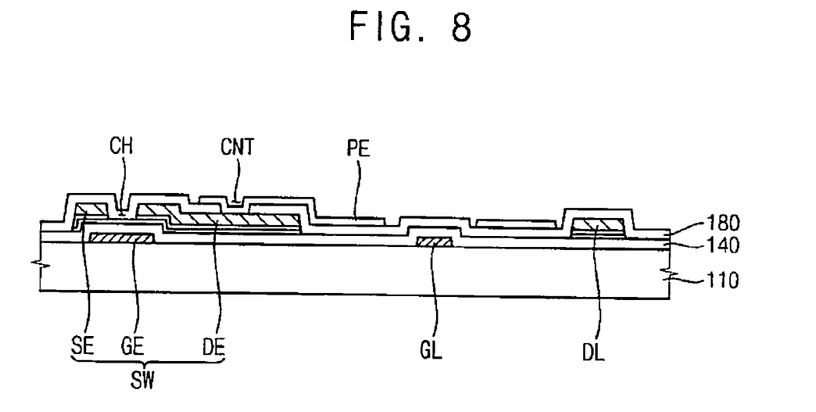

Referring to FIG. 8, after a passivation layer 180 is formed on the thin-film transistor SW and a contact hole CNT is formed in the passivation layer 180, a pixel electrode PE is formed. The output electrode DE is partially exposed via the contact hole CNT, and the pixel electrode PE makes contact with the output electrode DE through the contact hole CNT to connect the thin-film transistor SW to the pixel electrode PE.

According to the above descriptions, the etching composition according to the present invention may be used for forming the gate line GL and the control electrode GE. Thus, the gate line GL may be prevented from being broken in forming the gate line GL. In addition, the etching composition according to the present invention may be used for forming the data line DL, the input electrode SE and the output electrode DE so that the data line DL may be prevented from being broken.

According to the present invention, the etching composition does not use hydrogen peroxide as a main etching component, and thus the etching composition may prevent heat from being generated when etching the copper layer and thereby improve a stability of the etching composition so that an etching ability of the etching composition may be maintained for a longer time. In addition, the etching composition may etch the copper layer quickly in order to minimize damage to the copper layer. Therefore, a productivity and a manufacturing reliability of the metal pattern formed using the etching composition and the display substrate including the metal pattern may be improved.

It will be apparent to those skilled in the art that various modifications and variations can be made in the present invention without departing from the spirit and scope of the invention. Thus, it is intended that the present invention cover the modifications and variations of this invention provided they come within the scope of the appended claims and their equivalents.

What is claimed is:
1. An etching composition, comprising:
   about 0.1% by weight to about 25% by weight of ammonium persulfate;
   about 0.1% by weight to about 25% by weight of an organic acid;
   about 0.01% by weight to about 5% by weight of a chelating agent;
   about 0.01% by weight to about 5% by weight of a fluoride compound;
   about 0.01% by weight to about 5% by weight of a chloride compound; and
   about 0.01% by weight to about 2% by weight of an azole-based compound.

2. The etching composition of claim 1, wherein the chloride compound comprises at least one selected from the group consisting of hydrochloric acid (HCl), ammonium chloride ($NH_4Cl$), potassium chloride (KCl), iron (III) chloride ($FeCl_3$), sodium chloride (NaCl), ammonium perchlorate ($NH_4ClO_4$), potassium perchlorate ($K_4ClO_4$), sodium perchlorate ($Na_4ClO_4$), and zinc chloride ($ZnCl_2$).

3. The etching composition of claim 1, wherein the fluoride compound comprises at least one selected from the group consisting of hydrofluoric acid (HF), sodium fluoride (NaF), sodium bifluoride ($NaHF_2$), ammonium fluoride ($NH_4F$), ammonium bifluoride ($NH_4HF$), ammonium fluoroborate ($NH_4BF_4$), potassium fluoride (KF), potassium bifluoride ($KHF_2$), aluminium fluoride ($AlF_3$), hydrofluoroboric acid (HBF$_4$), lithium fluoride (LiF), potassium fluoroborate (KBF$_4$), calcium fluoride (CaF$_2$), and hexafluorosilicic acid (H$_2$SiF$_6$).

4. The etching composition of claim 1, wherein the organic acid comprises at least one selected from the group consisting of oxalic acid, oxalacetic acid, fumaric acid, malic acid, succinic acid, acetic acid, butyric acid, palmitic acid, tartaric acid, ascorbic acid, uric acid, sulfonic acid, sulfinic acid, formic acid, citric acid, isocitric acid, α-ketoglutaric acid, and glycolic acid.

5. The etching compound of claim 4, wherein the organic acid comprises:
   about 0.05% by weight to about 20% by weight of citric acid; and
   about 0.05% by weight to about 5% by weight of glycolic acid.

6. The etching compound of claim 1, wherein the chelating agent comprises at least one selected from the group consisting of nitrilotriacetic acid, alanine, amino butyric acid, glutamic acid, glycine, iminodiacetic acid and sarcosine.

7. The etching compound of claim 1, wherein the azole-based compound comprises at least one selected from the group consisting of benzotriazole, aminotetrazole, aminotetrazole potassium salt, imidazole and pyrazole.

* * * * *